(12) United States Patent
Hayes et al.

(10) Patent No.: US 12,724,670 B2
(45) **Date of Patent: *Sep. 1, 2026**

(54) STORAGE SYSTEM ACCOMMODATING DIFFERING TYPES OF STORAGE

(71) Applicant: PURE STORAGE, INC., Santa Clara, CA (US)

(72) Inventors: John Hayes, Mountain View, CA (US); John Colgrove, Los Altos, CA (US); John D. Davis, San Francisco, CA (US)

(73) Assignee: EVERPURE, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,772

(22) Filed: Jul. 31, 2023

(65) Prior Publication Data

US 2023/0376379 A1 Nov. 23, 2023

Related U.S. Application Data

(63) Continuation of application No. 16/863,472, filed on Apr. 30, 2020, now Pat. No. 11,714,715, which is a (Continued)

(51) Int. Cl.
*G06F 11/10* (2006.01)
*G06F 3/06* (2006.01)
(Continued)

(52) U.S. Cl.
CPC ............ *G06F 11/1076* (2013.01); *G06F 3/06* (2013.01); *G06F 3/0607* (2013.01);
(Continued)

(58) Field of Classification Search
CPC ...... G06F 11/1076; G06F 3/067; G06F 3/065; G06F 3/0632; G06F 3/0619;
(Continued)

(56) References Cited

U.S. PATENT DOCUMENTS 5,390,327 A 2/1995 Lubbers et al.
5,450,581 A 9/1995 Bergen et al.
(Continued)

FOREIGN PATENT DOCUMENTS

CN 101019120 A 8/2007
CN 102571904 A 7/2012
(Continued)

OTHER PUBLICATIONS

Extended European Search Report for European Application No. 15802905.8, mailed Jun. 14, 2016, 7 Pages.
(Continued)

*Primary Examiner* — Albert Decady
*Assistant Examiner* — Osman M Alshack

(57) ABSTRACT

A plurality of storage nodes in a single chassis is provided. The plurality of storage nodes in the single chassis is configured to communicate together as a storage cluster. Each of the plurality of storage nodes includes nonvolatile solid-state memory for user data storage. The plurality of storage nodes is configured to distribute the user data and metadata associated with the user data throughout the plurality of storage nodes such that the plurality of storage nodes maintain the ability to read the user data, using erasure coding, despite a loss of two of the plurality of storage nodes. A plurality of compute nodes is included in the single chassis, each of the plurality of compute nodes is configured to communicate with the plurality of storage nodes. A method for accessing user data in a plurality of storage nodes having nonvolatile solid-state memory is also provided.

20 Claims, 6 Drawing Sheets

Related U.S. Application Data continuation of application No. 15/941,580, filed on Mar. 30, 2018, now Pat. No. 10,671,480, which is a continuation of application No. 14/954,757, filed on Nov. 30, 2015, now Pat. No. 9,934,089, which is a continuation of application No. 14/610,766, filed on Jan. 30, 2015, now Pat. No. 9,201,600, which is a continuation of application No. 14/491,552, filed on Sep. 19, 2014, now Pat. No. 9,563,506, which is a continuation of application No. 14/296,151, filed on Jun. 4, 2014, now Pat. No. 8,850,108.

(51) Int. Cl.
*G06F 12/02* (2006.01)
*H03M 13/15* (2006.01)

(52) U.S. Cl.
CPC .......... *G06F 3/0613* (2013.01); *G06F 3/0619* (2013.01); *G06F 3/0632* (2013.01); *G06F 3/065* (2013.01); *G06F 3/0655* (2013.01); *G06F 3/067* (2013.01); *G06F 3/0688* (2013.01); *G06F 11/1068* (2013.01); *G06F 11/1092* (2013.01); *G06F 12/0246* (2013.01); *H03M 13/154* (2013.01); *G06F 11/108* (2013.01); *G06F 2201/845* (2013.01); *G06F 2212/7206* (2013.01); *G06F 2212/7207* (2013.01)

(58) Field of Classification Search
CPC .... G06F 3/0607; G06F 3/0655; G06F 3/0688; G06F 3/0613; G06F 3/06; G06F 11/1068; G06F 11/1092; G06F 12/0246; G06F 11/108; G06F 2212/7206; G06F 2201/845; G06F 2212/7207; H03M 13/154
USPC ......................... 714/763, 764, 755, 770, 773
See application file for complete search history.

(56) References Cited

U.S. PATENT DOCUMENTS 5,479,653 A 12/1995 Jones
5,488,731 A 1/1996 Mendelsohn
5,504,858 A 4/1996 Ellis et al.
5,564,113 A 10/1996 Bergen et al.
5,574,882 A 11/1996 Menon et al.
5,649,093 A 7/1997 Hanko et al.
5,883,909 A 3/1999 DeKoning et al.
6,000,010 A 12/1999 Legg
6,260,156 B1 7/2001 Garvin et al.
6,269,453 B1 7/2001 Krantz
6,275,898 B1 8/2001 DeKoning
6,453,428 B1 9/2002 Stephenson
6,523,087 B2 2/2003 Busser
6,535,417 B2 3/2003 Tsuda et al.
6,643,748 B1 11/2003 Wieland
6,725,392 B1 4/2004 Frey et al.
6,763,455 B2 7/2004 Hall
6,836,816 B2 12/2004 Kendall
6,985,995 B2 1/2006 Holland et al.
7,032,125 B2 4/2006 Holt et al.
7,047,358 B2 5/2006 Lee et al.
7,051,155 B2 5/2006 Talagala et al.
7,055,058 B2 5/2006 Lee et al.
7,065,617 B2 6/2006 Wang
7,069,383 B2 6/2006 Yamamoto et al.
7,076,606 B2 7/2006 Orsley
7,107,480 B1 9/2006 Moshayedi et al.
7,159,150 B2 1/2007 Kenchammana-Hosekote et al.
7,162,575 B2 1/2007 Dalal et al.
7,164,608 B2 1/2007 Lee
7,188,270 B1 3/2007 Nanda et al.
7,334,156 B2 2/2008 Land et al.
7,370,220 B1 5/2008 Nguyen et al.
7,386,666 B1 6/2008 Beauchamp et al.
7,398,285 B2 7/2008 Kisley
7,424,498 B1 9/2008 Patterson
7,424,592 B1 9/2008 Karr et al.
7,444,532 B2 10/2008 Masuyama et al.
7,480,658 B2 1/2009 Heinla et al.
7,484,056 B2 1/2009 Madnani et al.
7,484,057 B1 1/2009 Madnani et al.
7,484,059 B1 1/2009 Ofer et al.
7,536,506 B2 5/2009 Ashmore et al.
7,558,859 B2 7/2009 Kasiolas et al.
7,565,446 B2 7/2009 Talagala et al.
7,613,947 B1 11/2009 Coatney et al.
7,634,617 B2 12/2009 Misra
7,634,618 B2 12/2009 Misra
7,681,104 B1 3/2010 Sim-Tang et al.
7,681,105 B1 3/2010 Sim-Tang et al.
7,681,109 B2 3/2010 Litsyn et al.
7,730,257 B2 6/2010 Franklin
7,730,258 B1 6/2010 Smith et al.
7,730,274 B1 6/2010 Usgaonkar
7,743,276 B2 6/2010 Jacobson et al.
7,752,489 B2 7/2010 Deenadhayalan et al.
7,757,038 B2 7/2010 Kitahara
7,757,059 B1 7/2010 Ofer et al.
7,778,960 B1 8/2010 Chatterjee et al.
7,783,955 B2 8/2010 Murin
7,814,272 B2 10/2010 Barrall et al.
7,814,273 B2 10/2010 Barrall
7,818,531 B2 10/2010 Barral
7,827,351 B2 11/2010 Suetsugu et al.
7,827,439 B2 11/2010 Mathew et al.
7,831,768 B2 11/2010 Ananthamurthy et al.
7,856,583 B1 12/2010 Smith
7,870,105 B2 1/2011 Arakawa et al.
7,873,878 B2 1/2011 Belluomini et al.
7,885,938 B1 2/2011 Greene et al.
7,886,111 B2 2/2011 Klemm et al.
7,908,448 B1 3/2011 Chatterjee et al.
7,916,538 B2 3/2011 Jeon et al.
7,921,268 B2 4/2011 Jakob
7,930,499 B2 4/2011 Duchesne
7,941,697 B2 5/2011 Mathew et al.
7,958,303 B2 6/2011 Shuster
7,971,129 B2 6/2011 Watson et al.
7,975,115 B2 7/2011 Wayda et al.
7,984,016 B2 7/2011 Kisley
7,991,822 B2 8/2011 Bish et al.
8,006,126 B2 8/2011 Deenadhayalan et al.
8,010,485 B1 8/2011 Chatterjee et al.
8,010,829 B1 8/2011 Chatterjee et al.
8,020,047 B2 9/2011 Courtney
8,046,548 B1 10/2011 Chatterjee et al.
8,051,361 B2 11/2011 Sim-Tang et al.
8,051,362 B2 * 11/2011 Li ...................... G06F 11/1076 714/755
8,074,038 B2 12/2011 Lionetti et al.
8,082,393 B2 12/2011 Galloway et al.
8,086,603 B2 12/2011 Nasre et al.
8,086,634 B2 12/2011 Mimatsu
8,086,911 B1 12/2011 Taylor
8,090,837 B2 1/2012 Shin et al.
8,108,502 B2 1/2012 Tabbara et al.
8,117,388 B2 2/2012 Jernigan, IV
8,117,521 B2 2/2012 Parker et al.
8,140,821 B1 3/2012 Raizen et al.
8,145,838 B1 3/2012 Miller et al.
8,145,840 B2 3/2012 Koul et al.
8,175,012 B2 5/2012 Chu et al.
8,176,360 B2 5/2012 Frost et al.
8,176,405 B2 5/2012 Hafner et al.
8,180,855 B2 5/2012 Aiello et al.
8,200,922 B2 6/2012 McKean et al.
8,209,469 B2 6/2012 Carpenter et al.
8,225,006 B1 7/2012 Karamcheti
8,225,057 B1 * 7/2012 Zheng ................. G06F 11/1458 711/E12.001

(56) References Cited

U.S. PATENT DOCUMENTS 8,239,618 B2 8/2012 Kotzur et al.
8,244,999 B1 8/2012 Chatterjee et al.
8,261,016 B1 9/2012 Goel
8,271,455 B2 9/2012 Kesselman
8,285,686 B2 10/2012 Kesselman
8,305,811 B2 11/2012 Jeon
8,315,999 B2 11/2012 Chatley et al.
8,327,080 B1 * 12/2012 Der .................... G06F 12/0804 711/143
8,335,769 B2 12/2012 Kesselman
8,341,118 B2 12/2012 Drobychev et al.
8,351,290 B1 1/2013 Huang et al.
8,364,920 B1 1/2013 Parkison et al.
8,365,041 B2 1/2013 Olbrich et al.
8,375,146 B2 2/2013 Sinclair
8,397,016 B2 3/2013 Talagala et al.
8,402,152 B2 3/2013 Duran
8,412,880 B2 4/2013 Leibowitz et al.
8,423,739 B2 4/2013 Ash et al.
8,429,436 B2 4/2013 Fillingim et al.
8,452,928 B1 5/2013 Ofer et al.
8,473,698 B2 6/2013 Lionetti et al.
8,473,778 B2 6/2013 Simitci et al.
8,473,815 B2 6/2013 Chung et al.
8,479,037 B1 7/2013 Chatterjee et al.
8,484,414 B2 7/2013 Sugimoto et al.
8,498,967 B1 7/2013 Chatterjee et al.
8,504,797 B2 8/2013 Mimatsu
8,522,073 B2 8/2013 Cohen
8,533,408 B1 9/2013 Madnani et al.
8,533,527 B2 9/2013 Daikokuya et al.
8,539,177 B1 9/2013 Madnani et al.
8,544,029 B2 9/2013 Bakke et al.
8,549,224 B1 10/2013 Zeryck et al.
8,583,861 B1 11/2013 Ofer et al.
8,589,625 B2 11/2013 Colgrove et al.
8,595,455 B2 11/2013 Chatterjee et al.
8,615,599 B1 12/2013 Takefman et al.
8,627,136 B2 1/2014 Shankar et al.
8,627,138 B1 1/2014 Clark et al.
8,639,669 B1 1/2014 Douglis et al.
8,639,863 B1 1/2014 Kanapathippillai et al.
8,640,000 B1 1/2014 Cypher
8,650,343 B1 2/2014 Kanapathippillai et al.
8,660,131 B2 2/2014 Vermunt et al.
8,661,218 B1 2/2014 Piszczek et al.
8,671,072 B1 3/2014 Shah et al.
8,689,042 B1 4/2014 Kanapathippillai et al.
8,700,875 B1 4/2014 Barron et al.
8,706,694 B2 4/2014 Chatterjee et al.
8,706,914 B2 4/2014 Duchesneau
8,706,932 B1 4/2014 Kanapathippillai et al.
8,712,963 B1 4/2014 Douglis et al.
8,713,405 B2 4/2014 Healey, Jr. et al.
8,719,621 B1 5/2014 Karmarkar
8,725,730 B2 5/2014 Keeton et al.
8,751,859 B2 6/2014 Becker-Szendy et al.
8,756,387 B2 6/2014 Frost et al.
8,762,793 B2 6/2014 Grube et al.
8,769,232 B2 7/2014 Suryabudi et al.
8,775,858 B2 7/2014 Gower et al.
8,775,868 B2 7/2014 Colgrove et al.
8,788,913 B1 7/2014 Xin et al.
8,793,447 B2 7/2014 Usgaonkar et al.
8,799,746 B2 8/2014 Baker et al.
8,819,311 B2 8/2014 Liao
8,819,383 B1 8/2014 Jobanputra et al.
8,822,155 B2 9/2014 Sukumar et al.
8,824,261 B1 9/2014 Miller et al.
8,832,528 B2 9/2014 Thatcher et al.
8,838,541 B2 9/2014 Camble et al.
8,838,892 B2 9/2014 Li
8,843,700 B1 9/2014 Salessi et al.
8,850,108 B1 9/2014 Hayes et al.
8,850,288 B1 9/2014 Lazier et al.
8,856,593 B2 10/2014 Eckhardt et al.
8,856,619 B1 10/2014 Cypher
8,862,617 B2 10/2014 Kesselman
8,862,847 B2 10/2014 Feng et al.
8,862,928 B2 10/2014 Xavier et al.
8,868,825 B1 10/2014 Hayes et al.
8,874,836 B1 10/2014 Hayes et al.
8,880,793 B2 11/2014 Nagineni
8,880,825 B2 11/2014 Lionetti et al.
8,886,778 B2 11/2014 Nedved et al.
8,898,383 B2 11/2014 Yamamoto et al.
8,898,388 B1 11/2014 Kimmel
8,904,231 B2 12/2014 Coatney et al.
8,918,478 B2 12/2014 Ozzie et al.
8,930,307 B2 1/2015 Colgrove et al.
8,930,633 B2 1/2015 Amit et al.
8,943,357 B2 1/2015 Atzmony
8,949,502 B2 2/2015 McKnight et al.
8,959,110 B2 2/2015 Smith et al.
8,959,388 B1 2/2015 Kuang et al.
8,972,478 B1 3/2015 Storer et al.
8,972,779 B2 3/2015 Lee et al.
8,977,597 B2 3/2015 Ganesh et al.
8,996,828 B2 3/2015 Kalos et al.
9,003,144 B1 4/2015 Hayes et al.
9,009,724 B2 4/2015 Gold et al.
9,021,053 B2 4/2015 Bernbo et al.
9,021,215 B2 4/2015 Meir et al.
9,025,393 B2 5/2015 Wu et al.
9,043,372 B2 5/2015 Makkar et al.
9,047,214 B1 6/2015 Northcott
9,053,808 B2 6/2015 Sprouse et al.
9,058,155 B2 6/2015 Cepulis et al.
9,063,895 B1 6/2015 Madnani et al.
9,063,896 B1 6/2015 Madnani et al.
9,075,773 B1 * 7/2015 Rakitzis .............. G06F 11/0727
9,098,211 B1 8/2015 Madnani et al.
9,110,898 B1 8/2015 Chamness et al.
9,110,964 B1 8/2015 Shilane et al.
9,116,819 B2 8/2015 Cope et al.
9,117,536 B2 8/2015 Yoon et al.
9,122,401 B2 9/2015 Zaltsman et al.
9,123,422 B2 9/2015 Yu et al.
9,124,300 B2 9/2015 Sharon et al.
9,134,908 B2 9/2015 Horn et al.
9,153,337 B2 10/2015 Sutardja
9,158,472 B2 10/2015 Kesselman et al.
9,159,422 B1 10/2015 Lee et al.
9,164,891 B2 10/2015 Karamcheti et al.
9,183,136 B2 11/2015 Kawamura et al.
9,189,650 B2 11/2015 Jaye et al.
9,201,733 B2 12/2015 Verma et al.
9,207,876 B2 12/2015 Shu et al.
9,213,485 B1 12/2015 Hayes et al.
9,229,656 B1 1/2016 Contreras et al.
9,229,810 B2 1/2016 He et al.
9,235,475 B1 1/2016 Shilane et al.
9,244,626 B2 1/2016 Shah et al.
9,250,999 B1 2/2016 Barroso
9,251,066 B2 2/2016 Colgrove et al.
9,268,648 B1 2/2016 Barash et al.
9,268,806 B1 2/2016 Kesselman
9,271,229 B2 * 2/2016 Gong ................ H04W 52/0203
9,280,678 B2 3/2016 Redberg
9,286,002 B1 3/2016 Karamcheti et al.
9,292,214 B2 3/2016 Kalos et al.
9,298,760 B1 3/2016 Li et al.
9,304,908 B1 4/2016 Karamcheti et al.
9,311,969 B2 4/2016 Sharon et al.
9,311,970 B2 4/2016 Sharon et al.
9,323,663 B2 4/2016 Karamcheti et al.
9,323,667 B2 4/2016 Bennett
9,323,681 B2 4/2016 Apostolides et al.
9,335,942 B2 5/2016 Kumar et al.
9,348,538 B2 5/2016 Mallaiah et al.
9,355,022 B2 5/2016 Ravimohan et al.
9,384,082 B1 7/2016 Lee et al.
9,384,252 B2 7/2016 Akirav et al.
9,389,958 B2 7/2016 Sundaram et al.

(56) References Cited

U.S. PATENT DOCUMENTS 9,390,019 B2 7/2016 Patterson et al.
9,395,922 B2 7/2016 Nishikido et al.
9,396,202 B1 7/2016 Drobychev et al.
9,400,828 B2 7/2016 Kesselman et al.
9,405,478 B2 8/2016 Koseki et al.
9,411,685 B2 8/2016 Lee
9,417,960 B2 8/2016 Cai et al.
9,417,963 B2 8/2016 He et al.
9,430,250 B2 8/2016 Hamid et al.
9,430,542 B2 8/2016 Akirav et al.
9,432,541 B2 8/2016 Ishida
9,454,434 B2 9/2016 Sundaram et al.
9,471,579 B1 10/2016 Natanzon
9,477,554 B2 10/2016 Hayes et al.
9,477,632 B2 10/2016 Du
9,501,398 B2 11/2016 George et al.
9,525,737 B2 12/2016 Friedman
9,529,542 B2 12/2016 Friedman et al.
9,535,631 B2 1/2017 Fu et al.
9,552,248 B2 1/2017 Miller et al.
9,552,291 B2 1/2017 Munetoh et al.
9,552,299 B2 1/2017 Stalzer
9,563,517 B1 2/2017 Natanzon et al.
9,588,698 B1 3/2017 Karamcheti et al.
9,588,712 B2 3/2017 Kalos et al.
9,594,652 B1 3/2017 Sathiamoorthy et al.
9,600,193 B2 3/2017 Ahrens et al.
9,619,321 B1 4/2017 Haratsch et al.
9,619,430 B2 4/2017 Kannan et al.
9,645,754 B2 5/2017 Li et al.
9,667,720 B1 5/2017 Bent et al.
9,710,535 B2 7/2017 Aizman et al.
9,733,840 B2 8/2017 Karamcheti et al.
9,734,225 B2 8/2017 Akirav et al.
9,740,403 B2 8/2017 Storer et al.
9,740,700 B1 8/2017 Chopra et al.
9,740,762 B2 8/2017 Horowitz et al.
9,747,319 B2 8/2017 Bestler et al.
9,747,320 B2 8/2017 Kesselman
9,767,130 B2 9/2017 Bestler et al.
9,781,227 B2 10/2017 Friedman et al.
9,785,498 B2 10/2017 Misra et al.
9,798,486 B1 10/2017 Singh
9,804,925 B1 10/2017 Carmi et al.
9,811,285 B1 11/2017 Karamcheti et al.
9,811,546 B1 11/2017 Bent et al.
9,818,478 B2 11/2017 Chung
9,829,066 B2 11/2017 Thomas et al.
9,836,245 B2 12/2017 Hayes et al.
9,891,854 B2 2/2018 Munetoh et al.
9,891,860 B1 2/2018 Delgado et al.
9,892,005 B2 2/2018 Kedem et al.
9,892,186 B2 2/2018 Akirav et al.
9,904,589 B1 2/2018 Donlan et al.
9,904,717 B2 2/2018 Anglin et al.
9,910,748 B2 3/2018 Pan
9,910,904 B2 3/2018 Anglin et al.
9,934,237 B1 4/2018 Shilane et al.
9,940,065 B2 4/2018 Kalos et al.
9,946,604 B1 4/2018 Glass
9,952,809 B2 4/2018 Shah
9,959,167 B1 5/2018 Donlan et al.
9,965,539 B2 5/2018 D'Halluin et al.
9,998,539 B1 6/2018 Brock et al.
10,007,457 B2 6/2018 Hayes et al.
10,013,177 B2 7/2018 Liu et al.
10,013,311 B2 7/2018 Sundaram et al.
10,019,314 B2 7/2018 Yang et al.
10,019,317 B2 7/2018 Usvyatsky et al.
10,031,703 B1 7/2018 Natanzon et al.
10,061,512 B2 8/2018 Lin
10,073,626 B2 9/2018 Karamcheti et al.
10,082,985 B2 9/2018 Hayes et al.
10,089,012 B1 10/2018 Chen et al.
10,089,174 B2 10/2018 Yang
10,089,176 B1 10/2018 Donlan et al.
10,108,819 B1 10/2018 Donlan et al.
10,146,787 B2 12/2018 Bashyam et al.
10,152,268 B1 12/2018 Chakraborty et al.
10,157,098 B2 12/2018 Yang et al.
10,162,704 B1 12/2018 Kirschner et al.
10,180,875 B2 1/2019 Klein
10,185,730 B2 1/2019 Bestler et al.
10,235,065 B1 3/2019 Miller et al.
10,324,639 B2 6/2019 Seo
10,567,406 B2 2/2020 Astigarraga et al.
10,846,137 B2 11/2020 Vallala et al.
10,877,683 B2 12/2020 Wu et al.
11,076,509 B2 7/2021 Alissa et al.
11,106,810 B2 8/2021 Natanzon et al.
11,194,707 B2 12/2021 Stalzer
11,714,715 B2 8/2023 Hayes et al.
2002/0144059 A1 10/2002 Kendall
2003/0105984 A1 6/2003 Masuyama et al.
2003/0110205 A1 6/2003 Johnson
2004/0078466 A1* 4/2004 Coates ................ H04L 67/1097 707/999.01
2004/0128587 A1 7/2004 Kenchammana-Hosekote et al.
2004/0161086 A1 8/2004 Buntin et al.
2005/0001652 A1 1/2005 Malik et al.
2005/0076228 A1 4/2005 Davis et al.
2005/0235132 A1 10/2005 Karr et al.
2005/0278460 A1 12/2005 Shin et al.
2005/0283649 A1 12/2005 Turner et al.
2006/0015683 A1 1/2006 Ashmore et al.
2006/0114930 A1 6/2006 Lucas et al.
2006/0174157 A1 8/2006 Barrall et al.
2006/0248294 A1 11/2006 Nedved et al.
2007/0079068 A1 4/2007 Draggon
2007/0214194 A1 9/2007 Reuter
2007/0214314 A1 9/2007 Reuter
2007/0234016 A1 10/2007 Davis et al.
2007/0268905 A1 11/2007 Baker et al.
2008/0080709 A1 4/2008 Michtchenko et al.
2008/0107274 A1 5/2008 Worthy
2008/0155191 A1 6/2008 Anderson et al.
2008/0256141 A1 10/2008 Wayda et al.
2008/0295118 A1 11/2008 Liao
2008/0313241 A1 12/2008 Li et al.
2009/0077208 A1 3/2009 Nguyen et al.
2009/0138654 A1 5/2009 Sutardja
2009/0216910 A1 8/2009 Duchesneau
2009/0216920 A1 8/2009 Lauterbach et al.
2010/0017444 A1 1/2010 Chatterjee et al.
2010/0023722 A1 1/2010 Tabbara et al.
2010/0042636 A1 2/2010 Lu
2010/0094806 A1 4/2010 Apostolides et al.
2010/0115070 A1 5/2010 Missimilly
2010/0125695 A1 5/2010 Wu et al.
2010/0162076 A1 6/2010 Sim-Tang et al.
2010/0169707 A1* 7/2010 Mathew .............. G06F 11/2094 714/6.32
2010/0174576 A1 7/2010 Naylor
2010/0199123 A1* 8/2010 Cohen ................ G06F 11/1662 714/E11.073
2010/0220735 A1 9/2010 Vermunt et al.
2010/0268908 A1 10/2010 Ouyang et al.
2010/0306500 A1 12/2010 Mimatsu
2011/0029840 A1* 2/2011 Ozzie .................... H03M 13/05 714/763
2011/0035540 A1 2/2011 Fitzgerald et al.
2011/0040925 A1 2/2011 Frost et al.
2011/0060927 A1 3/2011 Fillingim et al.
2011/0119462 A1 5/2011 Leach et al.
2011/0219170 A1 9/2011 Frost et al.
2011/0231602 A1 9/2011 Woods et al.
2011/0238625 A1 9/2011 Hamaguchi et al.
2011/0264843 A1 10/2011 Haines et al.
2011/0289351 A1* 11/2011 Rashmi .............. H03M 13/616 714/6.32
2011/0302369 A1 12/2011 Goto et al.
2012/0005171 A1* 1/2012 Anglin ................. G06F 16/215 707/E17.007
2012/0011398 A1 1/2012 Eckhardt et al.

(56) References Cited

U.S. PATENT DOCUMENTS

2012/0060072 A1 3/2012 Simitci et al.
2012/0066375 A1 3/2012 Phaal
2012/0079318 A1 3/2012 Colgrove et al.
2012/0089567 A1 4/2012 Takahashi et al.
2012/0110249 A1 5/2012 Jeong et al.
2012/0131253 A1 5/2012 McKnight et al.
2012/0158923 A1 6/2012 Mohamed et al.
2012/0185624 A1 7/2012 Dang et al.
2012/0191900 A1 7/2012 Kunimatsu et al.
2012/0198152 A1 8/2012 Terry et al.
2012/0198261 A1 8/2012 Brown et al.
2012/0203712 A1 8/2012 Fennell
2012/0209943 A1 8/2012 Jung
2012/0226934 A1 9/2012 Rao
2012/0246435 A1 9/2012 Meir et al.
2012/0260055 A1 10/2012 Murase
2012/0311557 A1 12/2012 Resch
2013/0022201 A1 1/2013 Glew et al.
2013/0036314 A1 2/2013 Glew et al.
2013/0042056 A1 2/2013 Shats et al.
2013/0060884 A1* 3/2013 Bernbo ................ G06F 16/184 709/216
2013/0067188 A1 3/2013 Mehra et al.
2013/0073894 A1 3/2013 Xavier et al.
2013/0094509 A1 4/2013 Chen et al.
2013/0124776 A1 5/2013 Hallak et al.
2013/0132800 A1 5/2013 Healey, Jr. et al.
2013/0151653 A1 6/2013 Sawicki et al.
2013/0151771 A1 6/2013 Tsukahara et al.
2013/0173853 A1 7/2013 Ungureanu et al.
2013/0238554 A1 9/2013 Yucel et al.
2013/0275381 A1* 10/2013 De Schrijvr ........ H04L 67/1097 707/652
2013/0275390 A1 10/2013 Ozzie et al.
2013/0339314 A1 12/2013 Carpentier et al.
2013/0339635 A1 12/2013 Amit et al.
2013/0339818 A1* 12/2013 Baker .................. G06F 3/0667 714/763
2014/0040535 A1 2/2014 Lee et al.
2014/0040702 A1 2/2014 He et al.
2014/0047263 A1 2/2014 Coatney et al.
2014/0047269 A1 2/2014 Kim
2014/0063721 A1 3/2014 Herman et al.
2014/0064048 A1 3/2014 Cohen et al.
2014/0068224 A1 3/2014 Fan et al.
2014/0068627 A1 3/2014 Goh et al.
2014/0075252 A1 3/2014 Luo et al.
2014/0108723 A1 4/2014 Nowoczynski et al.
2014/0122510 A1 5/2014 Namkoong et al.
2014/0136880 A1 5/2014 Shankar et al.
2014/0181402 A1 6/2014 White
2014/0214772 A1 7/2014 Kadayam
2014/0220561 A1 8/2014 Sukumar et al.
2014/0237164 A1 8/2014 Le et al.
2014/0279905 A1* 9/2014 Muniswamy-Reddy .................... G06F 3/0683 707/639
2014/0279936 A1 9/2014 Bernbo et al.
2014/0280025 A1 9/2014 Eidson et al.
2014/0289588 A1 9/2014 Nagadomi et al.
2014/0330785 A1 11/2014 Isherwood et al.
2014/0372838 A1 12/2014 Lou et al.
2014/0379919 A1* 12/2014 Groover ................. H04L 47/70 709/226
2014/0380125 A1 12/2014 Calder et al.
2014/0380126 A1 12/2014 Yekhanin et al.
2015/0032720 A1 1/2015 James
2015/0039645 A1 2/2015 Lewis
2015/0039849 A1 2/2015 Lewis
2015/0089283 A1 3/2015 Kermarrec et al.
2015/0100746 A1 4/2015 Rychlik et al.
2015/0134824 A1* 5/2015 Mickens ................ H04L 67/60 709/226
2015/0153800 A1 6/2015 Lucas et al.
2015/0154418 A1 6/2015 Redberg
2015/0180714 A1 6/2015 Chunn et al.
2015/0277802 A1 10/2015 Oikarinen et al.
2015/0280959 A1 10/2015 Vincent
2015/0355974 A1 12/2015 Hayes et al.
2015/0363424 A1 12/2015 Strong et al.
2016/0004452 A1 1/2016 Hayes et al.
2016/0004479 A1 1/2016 Hayes et al.
2016/0006463 A1* 1/2016 Li ...................... H03M 13/373 714/766
2016/0026397 A1 1/2016 Nishikido et al.
2016/0182542 A1 6/2016 Staniford
2016/0191508 A1 6/2016 Bestler et al.
2016/0246537 A1 8/2016 Kim
2016/0248631 A1 8/2016 Duchesneau
2016/0378612 A1 12/2016 Hipsh et al.
2017/0091236 A1 3/2017 Hayes et al.
2017/0103092 A1 4/2017 Hu et al.
2017/0103094 A1 4/2017 Hu et al.
2017/0103098 A1 4/2017 Hu et al.
2017/0103116 A1 4/2017 Hu et al.
2017/0177236 A1 6/2017 Haratsch et al.
2017/0262202 A1 9/2017 Seo
2018/0039442 A1 2/2018 Shadrin et al.
2018/0054454 A1 2/2018 Astigarraga et al.
2018/0081958 A1 3/2018 Akirav et al.
2018/0101441 A1 4/2018 Hyun et al.
2018/0101587 A1 4/2018 Anglin et al.
2018/0101588 A1 4/2018 Anglin et al.
2018/0217756 A1 8/2018 Liu et al.
2018/0307560 A1 10/2018 Vishnumolakala et al.
2018/0321874 A1 11/2018 Li et al.
2019/0036703 A1 1/2019 Bestler
2019/0220315 A1 7/2019 Vallala et al.
2020/0034560 A1 1/2020 Natanzon et al.
2020/0326871 A1 10/2020 Wu et al.
2021/0360833 A1 11/2021 Alissa et al.

FOREIGN PATENT DOCUMENTS

CN 102782606 A 11/2012
CN 103019838 A 4/2013
CN 103093304 A 5/2013
CN 103135946 A 6/2013
CN 103793182 A 5/2014
CN 103929500 A 7/2014
CN 104603776 A 5/2015
CN 104750658 A 7/2015
EP 2164006 A2 3/2010
EP 2256621 A1 12/2010
EP 2570914 A2 3/2013
EP 2703991 A2 3/2014
JP 2007242018 A 9/2007
JP 2007265314 A 10/2007
WO 0213033 A1 2/2002
WO WO-2005048159 A1 5/2005
WO 2008103569 A1 8/2008
WO 2008157081 A2 12/2008
WO WO-2010147596 A1 12/2010
WO 2013032825 A2 3/2013

OTHER PUBLICATIONS

Extended European Search Report for European Application No. 16749576.1, mailed Aug. 1, 2018, 8 Pages.

Extended European Search Report for European Application No. 17793392.6, mailed Nov. 7, 2019, 7 Pages.

Haiping Q., "Research and Design of Blade Service Cluster Based on Centralized Storage," Computer Engineering, pp. 1-3.

International Preliminary Report on Patentability for International Application No. PCT/US2017/031162, mailed Nov. 15, 2018, 10 Pages.

International Search Report and Written Opinion for International Application No. PCT/US2017/031162, mailed Aug. 17, 2017, 11 Pages.

Maruthachalam D., et al., "A Distributed System Design for Next Generation Storage and Remote Replication," The Fifth Interna-

(56) References Cited

OTHER PUBLICATIONS tional Conference on the Applications of Digital Information and Web Technologies (ICADIWT), Feb. 2014, 6 Pages.
Naixiang A., "Research on Optimizing Strategies for Cloud-Assisted File Sharing and Publishing System," Chinese Doctoral Dissertation Full-text Database Information Technology Series, *I139-1.
Hwang et al., "RAID-x: A New Distributed Disk Array for I/O-Centric Cluster Computing", Proceedings of the Ninth International Symposium on High-performance Distributed Computing, Aug. 2000, pp. 279-286, The Ninth International Symposium on High-Performance Distributed Computing, IEEE Computer Society, Los Alamitos, CA.
International Search Report and Written Opinion, PCT/US2015/018169, May 15, 2015, 10 pages.
International Search Report and Written Opinion, PCT/US2015/034291, Sep. 30, 2015, 3 pages.
International Search Report and Written Opinion, PCT/US2015/034302, Sep. 11, 2015, 10 pages.
International Search Report and Written Opinion, PCT/US2015/039135, Sep. 18, 2015, 8 pages.
International Search Report and Written Opinion, PCT/US2015/039136, Sep. 23, 2015, 7 pages.
International Search Report and Written Opinion, PCT/US2015/039137, Oct. 1, 2015, 8 pages.
International Search Report and Written Opinion, PCT/US2015/039142, Sep. 24, 2015, 3 pages.
International Search Report and Written Opinion, PCT/US2015/044370, Dec. 15, 2015, 3 pages.
International Search Report and Written Opinion, PCT/US2016/014356, Jun. 28, 2016, 3 pages.
International Search Report and Written Opinion, PCT/US2016/014357, Jun. 29, 2016, 3 pages.
International Search Report and Written Opinion, PCT/US2016/014361, May 30, 2016, 3 pages.
International Search Report and Written Opinion, PCT/US2016/014604, May 19, 2016, 3 pages.
International Search Report and Written Opinion, PCT/US2016/016504, Jul. 6, 2016, 7 pages.
International Search Report and Written Opinion, PCT/US2016/023485, Jul. 21, 2016, 13 pages.
International Search Report and Written Opinion, PCT/US2016/024391, Jul. 12, 2016, 11 pages.
International Search Report and Written Opinion, PCT/US2016/026529, Jul. 19, 2016, 9 pages.
International Search Report and Written Opinion, PCT/US2016/031039, Aug. 18, 2016, 7 pages.
International Search Report and Written Opinion, PCT/US2016/033306, Aug. 19, 2016, 11 pages.
International Search Report and Written Opinion, PCT/US2016/047808, Nov. 25, 2016, 14 pages.
Kim et al., "Data Access Frequency based Data Replication Method using Erasure Codes in Cloud Storage System", Journal of the Institute of Electronics and Information Engineers, Feb. 2014, vol. 51, No. 2, 7 pages.
Schmid, "Raid Scaling Charts, Part 3:4-128 kB Stripes Compared", Tom's Hardware, Nov. 27, 2007, URL: http://www.tomshardware.com/reviews/RAID-SCALING-CHARTS.1735-4.html, 24 pages.
Stalzer, "FlashBlades: System Architecture and Applications", Proceedings of the 2nd Workshop on Architectures and Systems for Big Data, Jun. 2012, pp. 10-14, Association for Computing Machinery, New York, NY.
Storer et al., "Pergamum: Replacing Tape with Energy Efficient, Reliable, Disk-Based Archival Storage", FAST'08: Proceedings of the 6th USENIX Conference on File and Storage Technologies, Article No. 1, Feb. 2008, pp. 1-16, USENIX Association, Berkeley, CA.

* cited by examiner

STORAGE SYSTEM ACCOMMODATING DIFFERING TYPES OF STORAGE

CROSS REFERENCE TO RELATED APPLICATIONS

This is a continuation application for patent entitled to a filing date and claiming the benefit of earlier-filed U.S. Pat. No. 11,714,715, issued Aug. 1, 2023, which is a continuation of U.S. Pat. No. 10,671,480, issued Jun. 2, 2020, which is a continuation of U.S. Pat. No. 9,934,089, issued Apr. 3, 2018, which is a continuation of U.S. Pat. No. 9,201,600, issued Dec. 1, 2015, which is a continuation of U.S. Pat. No. 9,563,506, issued Feb. 7, 2017, which is a continuation of U.S. Pat. No. 8,850,108, issued Sep. 30, 2014, each of which are incorporated herein by reference in their entirety.

BACKGROUND

Solid-state memory, such as flash, is currently in use in solid-state drives (SSD) to augment or replace conventional hard disk drives (HDD), writable CD (compact disk) or writable DVD (digital versatile disk) drives, collectively known as spinning media, and tape drives, for storage of large amounts of data. Flash and other solid-state memories have characteristics that differ from spinning media. Yet, many solid-state drives are designed to conform to hard disk drive standards for compatibility reasons, which makes it difficult to provide enhanced features or take advantage of unique aspects of flash and other solid-state memory.

It is within this context that the embodiments arise.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
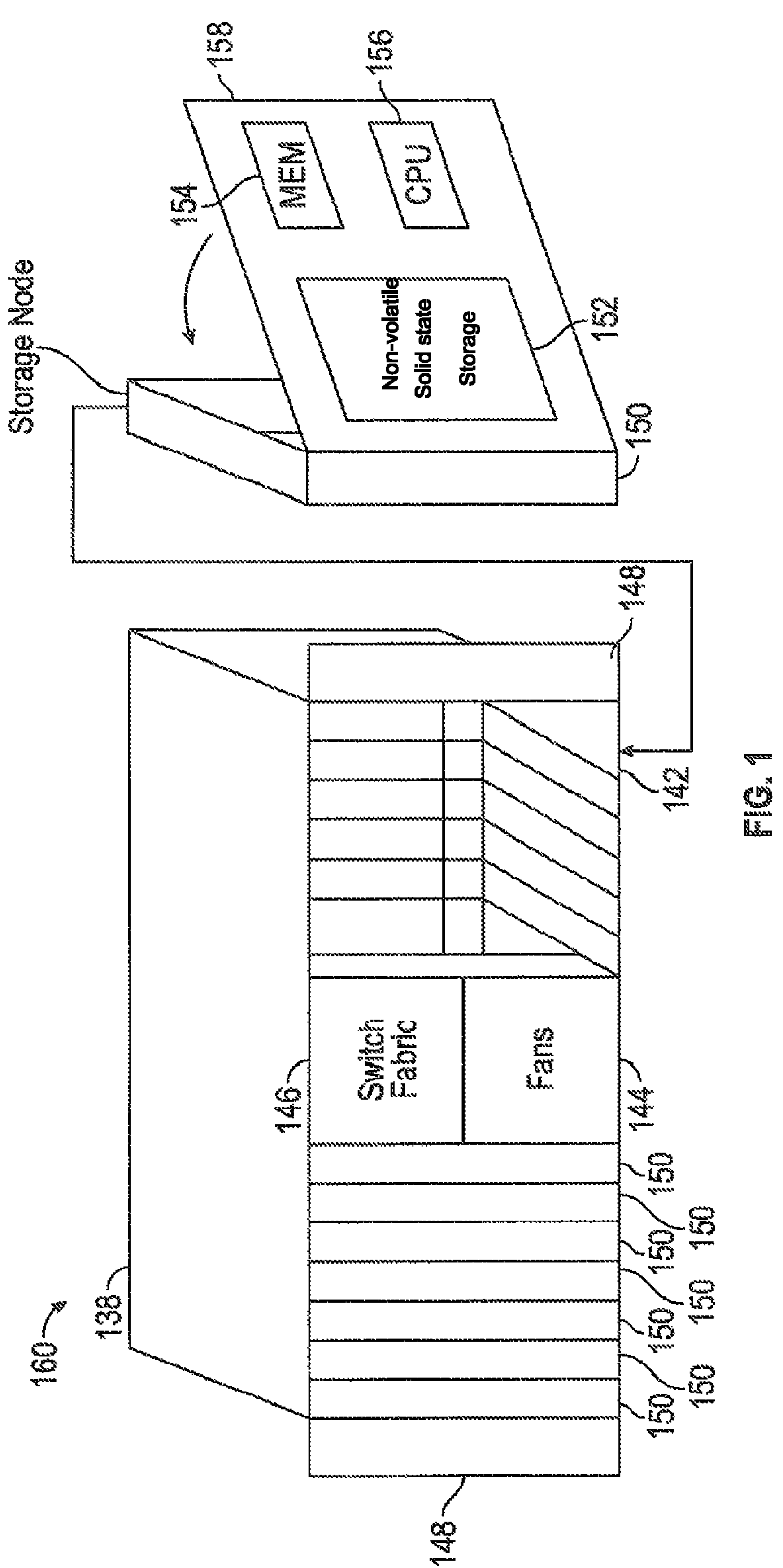
FIG. 1 is a perspective view of a storage cluster with multiple storage nodes and internal storage coupled to each storage node to provide network attached storage, in accordance with some embodiments.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid state memory units, which may be referred to as storage units. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Figure 2:
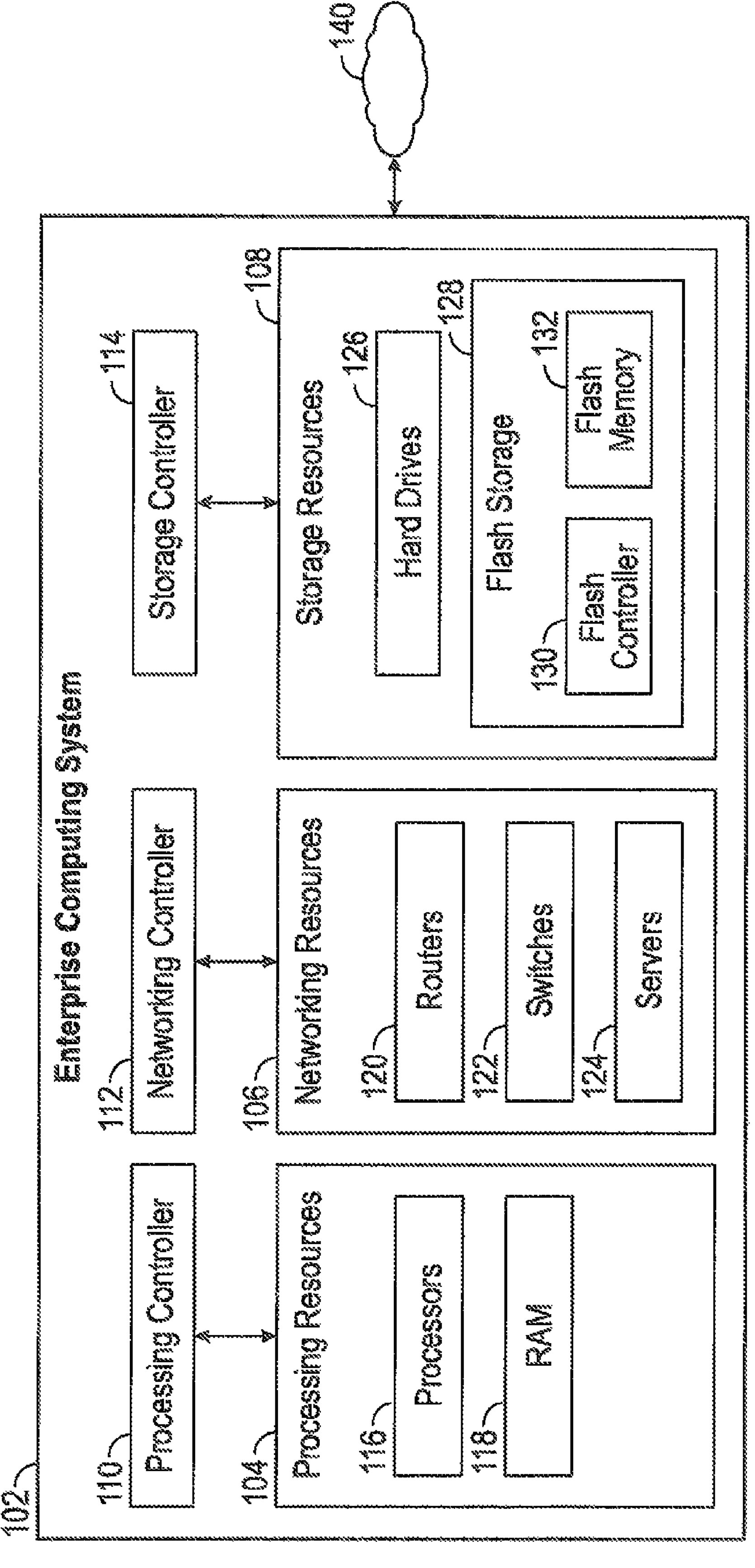
FIG. 2 is a system diagram of an enterprise computing system, which can use one or more of the storage clusters of FIG. 1 as a storage resource in some embodiments.

FIG. 2 is a system diagram of an enterprise computing system 102, which can use one or more of the storage nodes, storage clusters and/or non-volatile solid state storage of FIG. 1 as a storage resource 108. For example, flash storage 128 of FIG. 2 may integrate the storage nodes, storage clusters and/or non-volatile solid state storage of FIG. 1 in some embodiments. The enterprise computing system 102 has processing resources 104, networking resources 106 and storage resources 108, including flash storage 128. A flash controller 130 and flash memory 132 are included in the flash storage 128. In various embodiments, the flash storage 128 could include one or more storage nodes or storage clusters, with the flash controller 130 including the CPUs, and the flash memory 132 including the non-volatile solid state storage of the storage nodes. In some embodiments flash memory 132 may include different types of flash memory or the same type of flash memory. The enterprise computing system 102 illustrates an environment suitable for deployment of the flash storage 128, although the flash storage 128 could be used in other computing systems or devices, larger or smaller, or in variations of the enterprise computing system 102, with fewer or additional resources. The enterprise computing system 102 can be coupled to a network 140, such as the Internet, in order to provide or make use of services. For example, the enterprise computing system 102 could provide cloud services, physical computing resources, or virtual computing services.

In the enterprise computing system 102, various resources are arranged and managed by various controllers. A processing controller 110 manages the processing resources 104, which include processors 116 and random-access memory (RAM) 118. Networking controller 112 manages the networking resources 106, which include routers 120, switches 122, and servers 124. A storage controller 114 manages storage resources 108, which include hard drives

126 and flash storage 128. Other types of processing resources, networking resources, and storage resources could be included with the embodiments. In some embodiments, the flash storage 128 completely replaces the hard drives 126. The enterprise computing system 102 can provide or allocate the various resources as physical computing resources, or in variations, as virtual computing resources supported by physical computing resources. For example, the various resources could be implemented using one or more servers executing software. Files or data objects, or other forms of data, are stored in the storage resources 108.

In various embodiments, an enterprise computing system 102 could include multiple racks populated by storage clusters, and these could be located in a single physical location such as in a cluster or a server farm. In other embodiments the multiple racks could be located at multiple physical locations such as in various cities, states or countries, connected by a network. Each of the racks, each of the storage clusters, each of the storage nodes, and each of the non-volatile solid state storage could be individually configured with a respective amount of storage space, which is then reconfigurable independently of the others. Storage capacity can thus be flexibly added, upgraded, subtracted, recovered and/or reconfigured at each of the non-volatile solid state storages. As mentioned previously, each storage node could implement one or more servers in some embodiments.

Figures 3, 4:
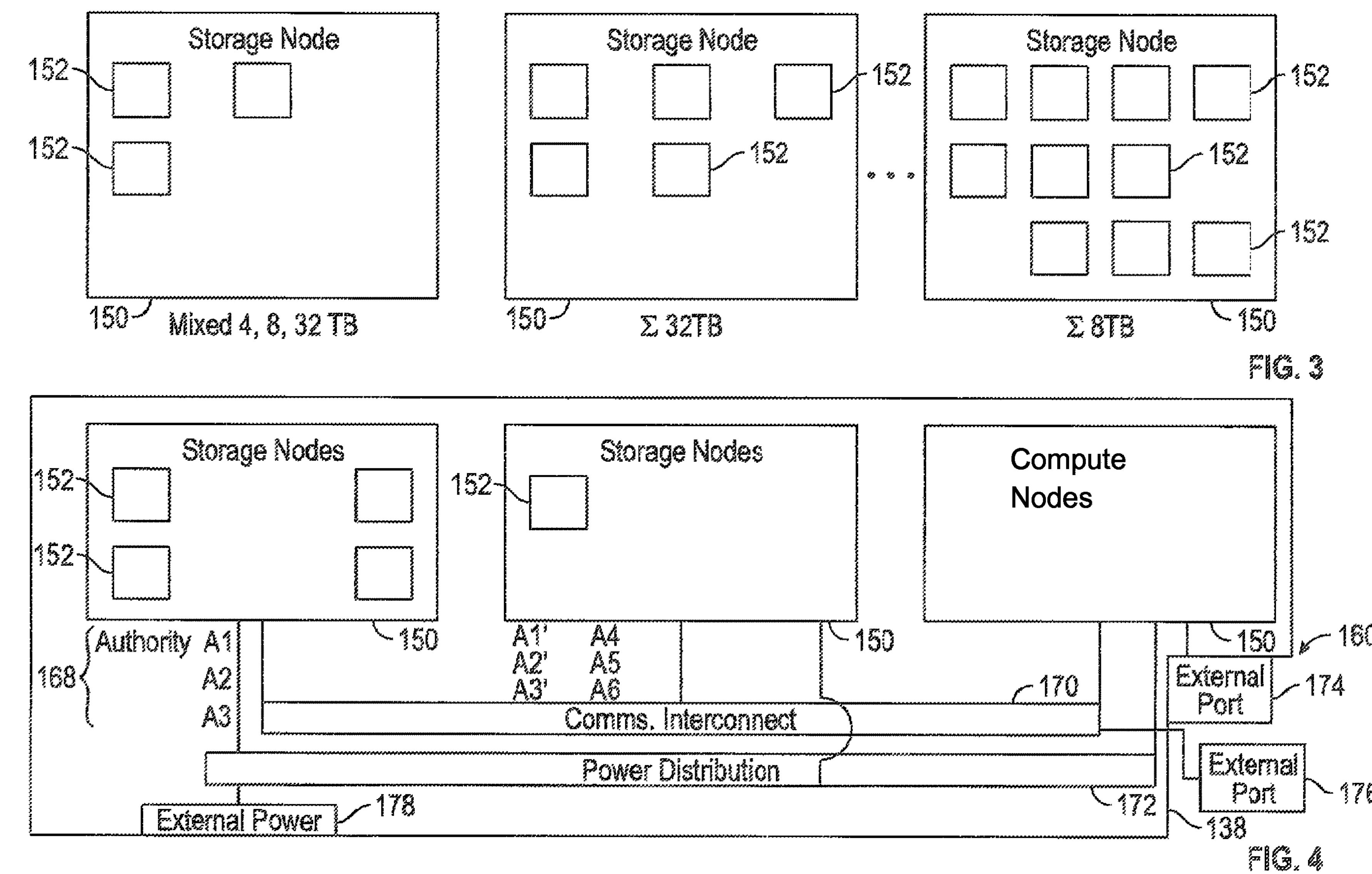
FIG. 3 is a block diagram showing multiple storage nodes and non-volatile solid state storage with differing capacities, suitable for use in the storage cluster of FIG. 1 in accordance with some embodiments.
FIG. 4 is a block diagram showing an interconnect switch coupling multiple storage nodes in accordance with some embodiments.

FIG. 3 is a block diagram showing multiple storage nodes 150 and non-volatile solid state storage 152 with differing capacities, suitable for use in the chassis of FIG. 1. Each storage node 150 can have one or more units of non-volatile solid state storage 152. Each non-volatile solid state storage 152 may include differing capacity from other non-volatile solid state storage 152 on a storage node 150 or in other storage nodes 150 in some embodiments. Alternatively, all of the non-volatile solid state storages 152 on a storage node or on multiple storage nodes can have the same capacity or combinations of the same and/or differing capacities. This flexibility is illustrated in FIG. 3, which shows an example of one storage node 150 having mixed non-volatile solid state storage 152 of four, eight and thirty-two TB capacity, another storage node 150 having non-volatile solid state storage 152 each of thirty-two TB capacity, and still another storage node having non-volatile solid state storage 152 each of eight TB capacity. Various further combinations and capacities are readily devised in accordance with the teachings herein. In the context of clustering, e.g., clustering storage to form a storage cluster, a storage node can be or include a non-volatile solid state storage 152. Non-volatile solid state storage 152 is a convenient clustering point as the non-volatile solid state storage 152 may include a nonvolatile random access memory (NVRAM) component, as will be further described below.

Referring to FIGS. 1 and 3, storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 5:
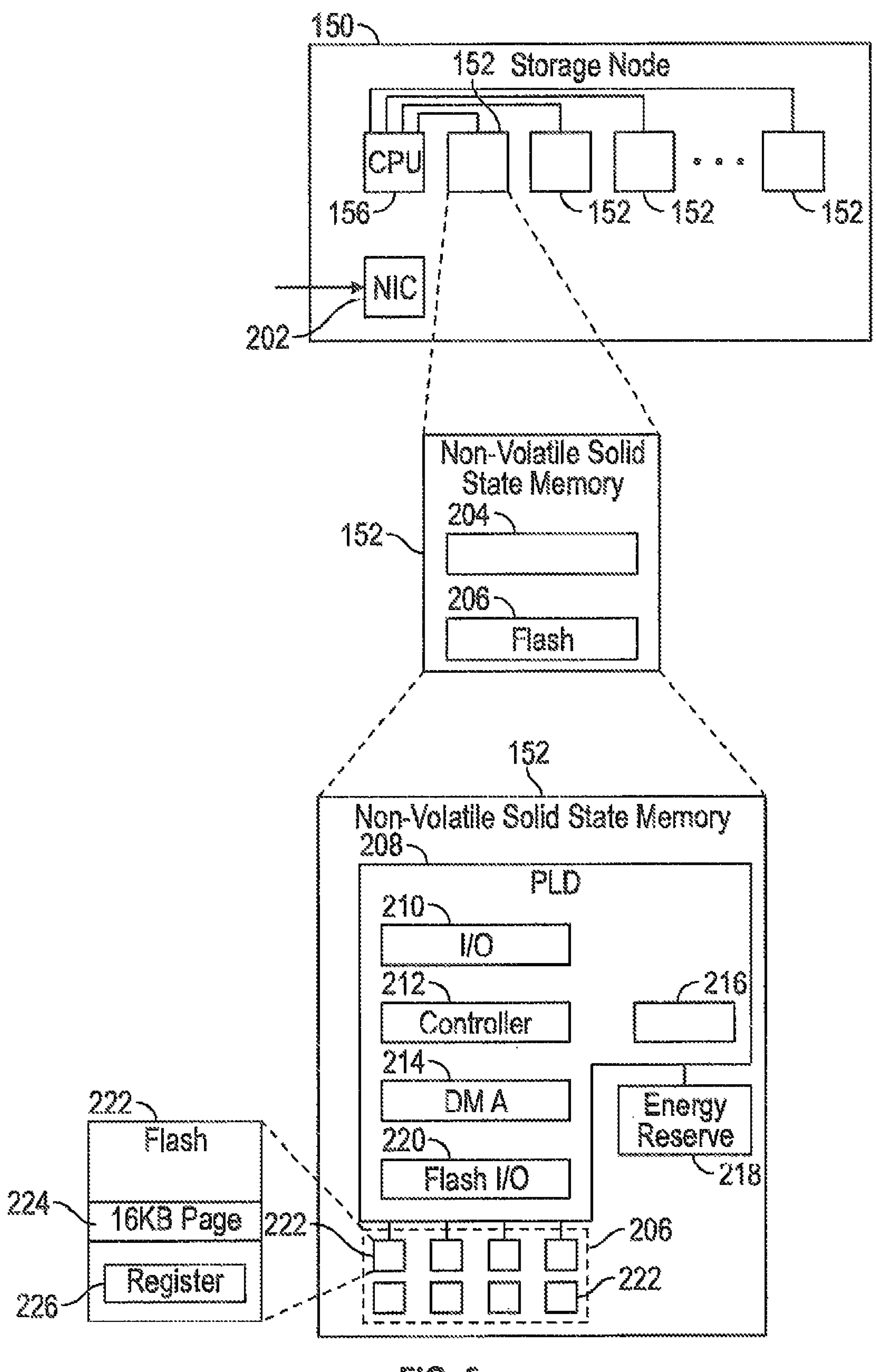
FIG. 5 is a multiple level block diagram, showing contents of a storage node and contents of one of the non-volatile solid state storage units in accordance with some embodiments.

FIG. 4 is a block diagram showing a communications interconnect 170 and power distribution bus 172 coupling multiple storage nodes 150. Referring back to FIG. 1, the communications interconnect 170 can be included in or implemented with the switch fabric 146 in some embodiments. Where multiple storage clusters 160 occupy a rack, the communications interconnect 170 can be included in or implemented with a top of rack switch, in some embodiments. As illustrated in FIG. 4, storage cluster 160 is enclosed within a single chassis 138. External port 176 is coupled to storage nodes 150 through communications interconnect 170, while external port 174 is coupled directly to a storage node. External power port 178 is coupled to power distribution bus 172. Storage nodes 150 may include varying amounts and differing capacities of non-volatile solid state storage 152 as described with reference to FIG. 3. In addition, one or more storage nodes 150 may be a compute only storage node as illustrated in FIG. 4. A compute only storage node 150 performs computing functions for the storage cluster 160, or functions as a compute node to perform computing functions and/or execute applications, which may make use of user data destined for, stored in, or retrieved from the non-volatile solid state storages 152 in the storage cluster 160, in various embodiments. It should be appreciated that the compute node can contain one or more central processing units, graphic processing units, programmable logic device, such as a field programmable gate array, application specific integrated circuit, or generic compute elements, some of which are illustrated in FIG. 5. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, Mode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 1-4, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIG. 5) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top is the directory entries (file names) which link to an inode. Inodes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudorandomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being replicated. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

FIG. 5 is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 5, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 5, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Figure 6:
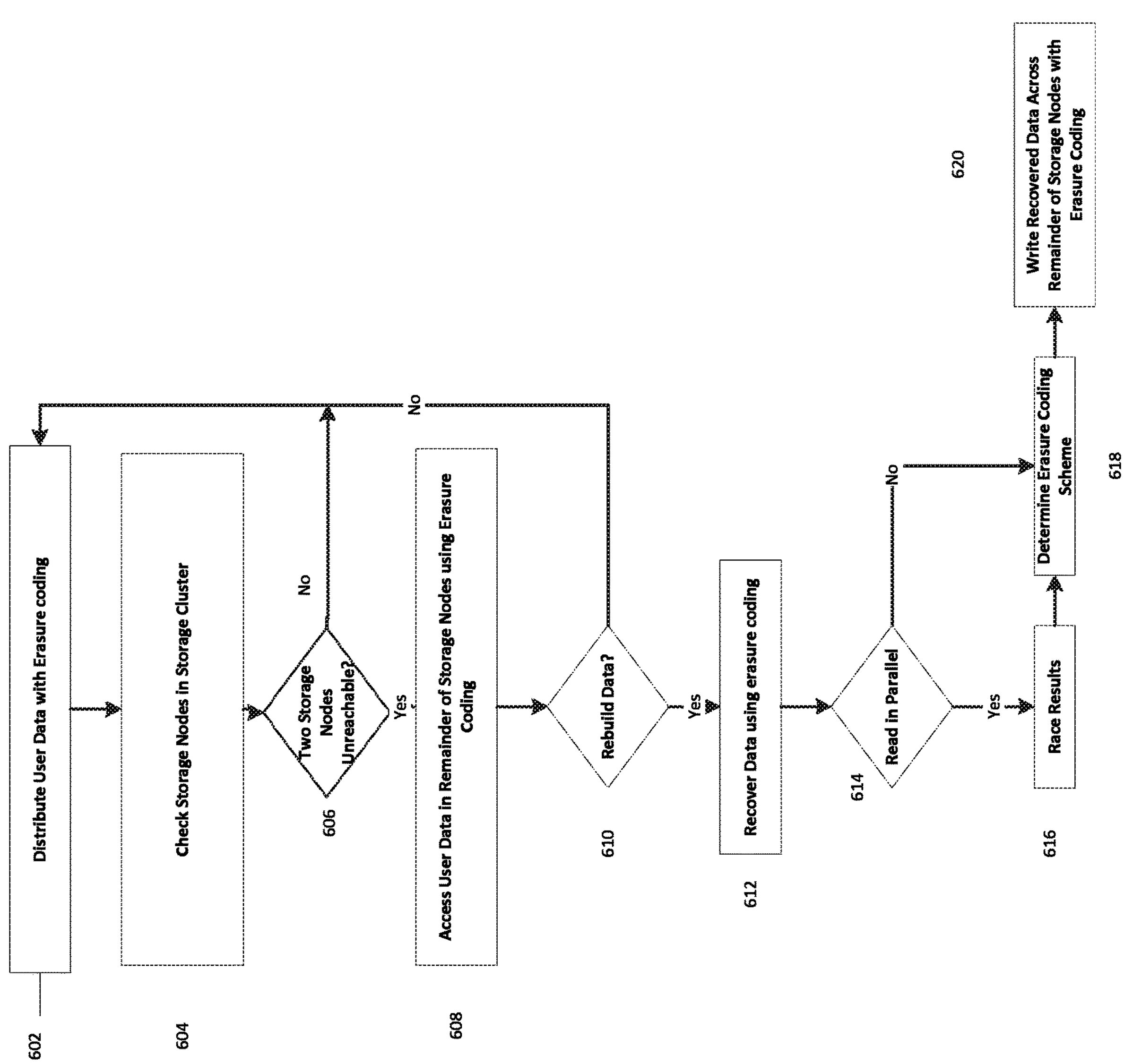
FIG. 6 is a flow diagram of a method for operating a storage cluster, which can be practiced on or by embodiments of the storage cluster, storage nodes and/or non-volatile solid state storages in accordance with some embodiments.

FIG. 6 is a flow diagram for a method of operating a storage cluster. The method can be practiced on or by various embodiments of a storage cluster and storage nodes as described herein. Various steps of the method can be performed by a processor, such as a processor in a storage cluster or a processor in a storage node. Portions or all of the method can be implemented in software, hardware, firmware or combinations thereof. The method initiates with action 602, where user data is distributed with erasure coding. For example, the user data could be distributed across the storage nodes of a storage cluster using one or more erasure coding schemes. Two erasure coding schemes (or more, in some embodiments) can coexist in the storage nodes in the storage cluster. In some embodiments, each storage node can determine which of a plurality of erasure coding schemes to apply when writing data, and can determine which erasure coding scheme to apply when reading data. These can be the same or differing erasure coding schemes.

The method proceeds to action 604 where the storage nodes in the storage cluster are checked. In some embodiments the storage nodes are checked for a heartbeat where each storage node periodically issues a message which acts as the heartbeat. In alternative embodiments the checking is in the form of querying a storage node, and the lack of response to the query indicates that the storage node is failing. In a decision action 606, it is determined if two storage nodes are unreachable. For example, if two of the storage nodes are no longer issuing heartbeats, or two of the storage nodes fail to respond to queries, or some combination of these or other indications, one of the other storage nodes could determine that two of the storage nodes are unreachable. If this is not the situation, flow branches back to the action 602, in order to continue distributing user data, e.g., writing user data into the storage nodes as the user data arrives for storage. If it is determined that two of the storage nodes are unreachable, flow continues to action 608.

In decision action 608, the user data is accessed in the remainder of the storage nodes, using erasure coding. It should be appreciated that user data refers to data originating from one or more users or client systems or other sources external to the storage cluster in some embodiments. In some embodiments erasure coding types include double redundancy, in which case, with two failed storage nodes, a remaining storage node has readable user data. Erasure coding types could include error correcting code allowing loss of two bits out of a code word, with data distributed across storage nodes so that the data can be recovered despite loss of two of the storage nodes. In a decision action 610, it is determined if the data is to be rebuilt. If the data should not be rebuilt, flow branches back to the action 602, in order to continue distributing user data with erasure coding. If the data should be rebuilt, flow branches to the action 612. In some embodiments, the decision to rebuild the data occurs after two storage nodes are unreachable, although the decision to rebuild the data may occur after one storage node is unreachable is other embodiments. Various mechanisms that could be taken into account in the decision to rebuild the data include error correction counts, error correction rates, failures of reads, failures of writes, loss of heartbeat, failure to reply to queries, and so on. Appropriate modification to the method of FIG. 6 is readily understood for these and further embodiments.

In the action 612, the data is recovered using erasure coding. This could be according to examples of erasure coding as discussed above, regarding the action 608. More specifically, the data is recovered from the remaining storage nodes, e.g., using error correcting code or reading from a remaining storage node, as appropriate. Data could be recovered using two or more types of erasure coding, in cases where these two or more types of erasure coding coexist in the storage nodes. In a decision action 614, it is determined if the data should be read in parallel. In some embodiments, there is more than one data path (e.g., as with double redundancy of data), and the data could be read in parallel across two paths. If the data is not to be read in parallel, flow branches to the action 618. If the data is to be read in parallel, flow branches to the action 616, in which the results are raced. The winner of the race is then used as the recovered data.

In an action 618, the erasure coding scheme for rebuilding is determined. For example, in some embodiments each storage node can decide which of two or more erasure coding schemes to apply when writing the data across the storage units. In some embodiments, the storage nodes cooperate to determine the erasure coding scheme. This can be done by determining which storage node has responsibility for the erasure coding scheme for a specific data segment, or by assigning a storage node to have this responsibility. In some embodiments, various mechanisms such as witnessing, voting, or decision logic, and so on, are employed to achieve this action. Non-volatile solid state storage may act as witnesses (in some embodiments) or voters (in some embodiments), so that if one copy of an authority becomes defective, the remaining functioning non-volatile solid state storage and the remaining copies of the authorities can determine the contents of the defective authority. In an action 620, the recovered data is written across the remainder of the storage nodes, with erasure coding. For example, the erasure coding scheme that is determined for the rebuilding could be different from the erasure coding scheme that is applied in recovering the data, i.e., in reading the data. More specifically, loss of two of the storage nodes may mean that some erasure coding schemes are no longer applicable to the remaining storage nodes, and the storage nodes then switch to an erasure coding scheme that is applicable to the remaining storage nodes.

Figure 7:
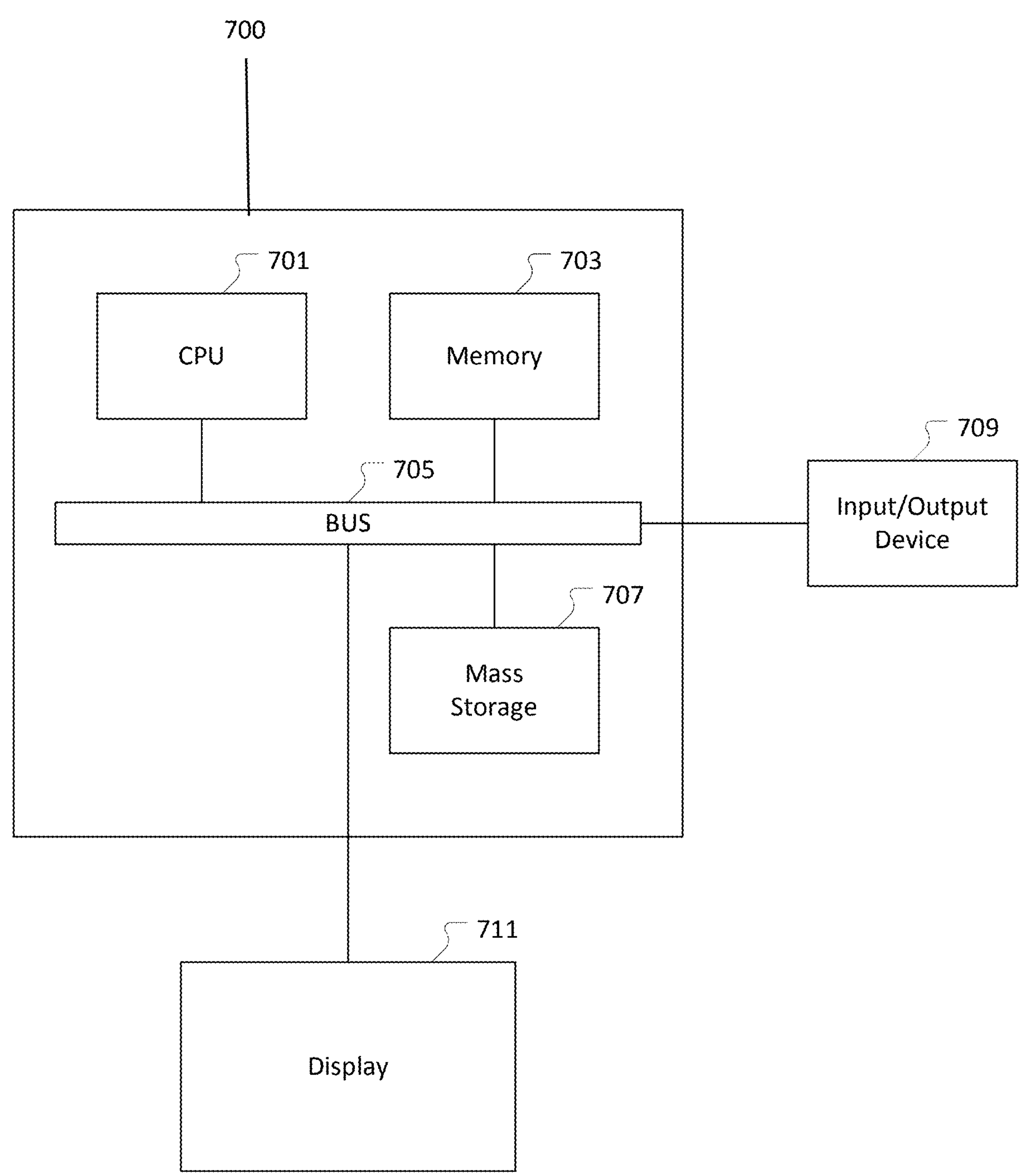
FIG. 7 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 7 is an illustration showing an exemplary computing device which may implement the embodiments described herein. The computing device 700 of FIG. 7 may be used to perform embodiments of the functionality for a storage node or a non-volatile solid state storage in accordance with some embodiments. The computing device 700 includes a central processing unit (CPU) 701, which is coupled through a bus 705 to a memory 703, and mass storage device 707. Mass storage device 707 represents a persistent data storage device such as a disc drive, which may be local or remote in some embodiments. The mass storage device 707 could implement a backup storage, in some embodiments. Memory 703 may include read only memory, random access memory, etc. Applications resident on the computing device 700 may be stored on or accessed via a computer readable medium such as memory 703 or mass storage device 707 in some embodiments. Applications may also be in the form of modulated electronic signals modulated accessed via a network modem or other network interface of the computing device. It should be appreciated that CPU 701 may be embodied in a general-purpose processor, a special purpose processor, or a specially programmed logic device in some embodiments.

Display 711 is in communication with CPU 701, memory 703, and mass storage device 707, through bus 705. Display 711 is configured to display any visualization tools or reports associated with the system described herein. Input/output device 709 is coupled to bus 505 in order to communicate information in command selections to CPU 701. It should be appreciated that data to and from external devices may be communicated through the input/output device 709. CPU 701 can be defined to execute the functionality described herein to enable the functionality described with reference to FIGS. 1-6. The code embodying this functionality may be stored within memory 703 or mass storage device 707 for execution by a processor such as CPU 701 in some embodiments. The operating system on the computing device may be MS-WINDOWS™ UNIX™ LINUX™ iOS™ CentOS™ Android™ Redhat Linux™ z/OS™ or other known operating systems. It should be appreciated that the embodiments described herein may be integrated with virtualized computing system also.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method, comprising:

receiving data for distribution throughout a plurality of storage nodes; and determining an erasure coding scheme to be applied to the received data for storage within storage memory associated with respective storage node, wherein at least one of the plurality of storage nodes is configured to support differing types of solid state memory within the at least one storage node, wherein placement of the data for storage redundancy is independent of placement of owners of the data for data consistency.

2. The method of claim 1, wherein differing erasure codes are utilized within one of the plurality of storage nodes.

3. The method of claim 1, further comprising:
mapping a hash value for a segment of the data to an identifier that has ownership of the segment.

4. The method of claim 1, wherein the plurality of storage nodes are distributed throughout multiple chassis.

5. The method of claim 1, wherein the solid state memory comprises flash memory.

6. The method of claim 1, wherein multiple erasure coding schemes are utilized for application to the data and wherein the multiple erasure coding schemes includes two or more differing erasure coding schemes coexisting in the plurality of storage nodes.

7. The method of claim 1, wherein at least one of the plurality of storage nodes has storage memory with differing storage capacities.

8. A tangible, non-transitory, computer-readable media having instructions thereupon which, when executed by a processor, cause the processor to perform a method comprising:
receiving data for distribution throughout a plurality of storage nodes; and
determining an erasure coding scheme to be applied to the received data for storage within storage memory of respective storage node, wherein at least one of the plurality of storage nodes is configured to support differing types of solid state memory within the at least one storage node, wherein placement of the data for storage redundancy is independent of placement of owners of the data for data consistency.

9. The computer readable media of claim 8, wherein differing erasure codes are utilized within one of the plurality of storage nodes.

10. The computer readable media of claim 8, further comprising:
mapping a hash value for a segment of the data to an identifier that has ownership of the segment.

11. The computer readable media of claim 8 wherein the plurality of storage nodes are distributed throughout multiple chassis.

12. The computer readable media of claim 8, wherein the solid state memory comprises flash memory.

13. The computer readable media of claim 8, wherein multiple erasure coding schemes are utilized for application to the data and wherein the multiple erasure coding schemes includes two or more differing erasure coding schemes coexisting in the plurality of storage nodes.

14. The computer readable media of claim 8, wherein at least one of the plurality of storage nodes has storage memory with differing storage capacities.

15. A storage cluster, comprising:
a plurality solid-state storage nodes having solid state memory;
a processor, configurable to execute instructions causing the processor to:
distribute data throughout the plurality of storage nodes; and
determine an erasure coding scheme to be applied to the distributed data within respective storage node, wherein at least one of the plurality of storage nodes is configured to support differing types of solid state memory within the at least one storage node, wherein placement of the data for storage redundancy is independent of placement of owners of the data for data consistency.

16. The storage cluster of claim 15, wherein differing erasure codes are utilized within one of the plurality of storage nodes.

17. The storage cluster of claim 15, wherein the plurality of storage nodes are distributed throughout multiple chassis.

18. The storage cluster of claim 15, wherein the solid state memory comprises flash memory.

19. The storage cluster of claim 15, wherein the multiple erasure coding schemes includes two or more differing erasure codes coexisting in the at least one of the plurality of storage nodes.

20. The storage cluster of claim 15, wherein the at least one of the plurality of storage nodes has solid state memory with differing storage capacities and wherein the solid state memory with differing storage capacities stores segments of the data having differing erasure coding schemes.

* * * * *